(12) United States Patent
Itsumi et al.

(10) Patent No.: US 11,448,622 B2
(45) Date of Patent: Sep. 20, 2022

(54) ULTRASONIC DEVICE AND INSPECTION DEVICE

(71) Applicant: Kabushiki Kaisha Toshiba, Minato-ku (JP)

(72) Inventors: Kazuhiro Itsumi, Koto (JP); Yasuharu Hosono, Kawasaki (JP); Tomio Ono, Yokohama (JP); Mitsunaga Saito, Inzai (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 572 days.

(21) Appl. No.: 16/297,767

(22) Filed: Mar. 11, 2019

(65) Prior Publication Data

US 2020/0080974 A1    Mar. 12, 2020

(30) Foreign Application Priority Data

Sep. 11, 2018   (JP) .............................. JP2018-169697

(51) Int. Cl.

| | | |
|---|---|---|
| *H01L 41/113* | (2006.01) | |
| *H01L 41/047* | (2006.01) | |
| *B06B 1/06* | (2006.01) | |
| *G01N 29/34* | (2006.01) | |
| *H01L 41/083* | (2006.01) | |
| *G01N 29/32* | (2006.01) | |
| *H01L 41/04* | (2006.01) | |

(52) U.S. Cl.
CPC .......... *G01N 29/348* (2013.01); *B06B 1/064* (2013.01); *G01N 29/32* (2013.01); *G01N 29/346* (2013.01); *H01L 41/042* (2013.01); *H01L 41/0471* (2013.01); *H01L 41/083* (2013.01); *H01L 41/1132* (2013.01)

(58) Field of Classification Search
CPC ..... B06B 1/064; B06B 1/0603; B06B 1/0607; B06B 1/0622; H01L 41/042; H01L 41/0471; H01L 41/083; H01L 41/1132
USPC .................................................. 310/322, 334
See application file for complete search history.

(56) References Cited

U.S. PATENT DOCUMENTS

| | | |
|---|---|---|
| 6,984,922 B1 | 1/2006 | Nagahara et al. |
| 2009/0230822 A1* | 9/2009 | Kushculey ............ B06B 1/0637 310/366 |

(Continued)

FOREIGN PATENT DOCUMENTS

| | | |
|---|---|---|
| JP | 2-189139 | 7/1990 |
| JP | 2003-199371 | 7/2003 |

(Continued)

*Primary Examiner* — Derek J Rosenau
(74) *Attorney, Agent, or Firm* — Oblon, McClelland, Maier & Neustadt, L.L.P.

(57) ABSTRACT

According to one embodiment, an ultrasonic device includes an ultrasonic transmitter. The ultrasonic transmitter includes a first element, a second element, and a driver. The first element is flexing-vibratable at a first resonant frequency. The second element is flexing-vibratable at a second resonant frequency different from the first resonant frequency. The driver is configured to supply a first electrical signal to the first element and to supply a second electrical signal to the second element. The first electrical signal includes a first signal having the first resonant frequency. The second electrical signal includes a second signal having the second resonant frequency.

20 Claims, 7 Drawing Sheets

(56) References Cited

U.S. PATENT DOCUMENTS

| | | | |
|---|---|---|---|
| 2013/0293065 A1* | 11/2013 | Hajati | B06B 1/0629 |
| | | | 310/334 |
| 2015/0097468 A1* | 4/2015 | Hajati | B06B 1/0622 |
| | | | 310/334 |
| 2016/0121368 A1* | 5/2016 | Nakamura | G10K 13/00 |
| | | | 600/459 |
| 2019/0025102 A1* | 1/2019 | Sugaya | H04R 17/00 |
| 2019/0283995 A1 | 9/2019 | Itsumi et al. | |

FOREIGN PATENT DOCUMENTS

| | | |
|---|---|---|
| JP | 2004-72755 | 3/2004 |
| JP | 2005-253751 A1 | 9/2005 |
| JP | 4632728 | 2/2011 |
| JP | 2011-139295 | 7/2011 |

* cited by examiner

ULTRASONIC DEVICE AND INSPECTION DEVICE

CROSS-REFERENCE TO RELATED APPLICATIONS

This application is based upon and claims the benefit of priority from Japanese Patent Application No. 2018-169697, filed on Sep. 11, 2018; the entire contents of which are incorporated herein by reference.

FIELD

Embodiments described herein relate generally to an ultrasonic device and an inspection device.

BACKGROUND

For example, when inspecting an object (an inspection object) such as a banknote or the like, an ultrasonic device is used to transmit an ultrasonic wave toward the object and receive an ultrasonic wave from the object. It is desirable to improve the resolution of an inspection device and the ultrasonic device.

DETAILED DESCRIPTION

According to one embodiment, an ultrasonic device includes an ultrasonic transmitter. The ultrasonic transmitter includes a first element, a second element, and a driver. The first element is flexing-vibratable at a first resonant frequency. The second element is flexing-vibratable at a second resonant frequency different from the first resonant frequency. The driver is configured to supply a first electrical signal to the first element and to supply a second electrical signal to the second element. The first electrical signal includes a first signal having the first resonant frequency. The second electrical signal includes a second signal having the second resonant frequency.

According to another embodiment, an ultrasonic device includes an ultrasonic transmitter. The ultrasonic transmitter includes a first element, a second element, a supporter, and a driver. The first element includes a first member region, a first electrode, a first counter electrode provided between the first member region and the first electrode, and a first piezoelectric layer provided between the first electrode and the first counter electrode and supported by the supporter. The second element includes a second member region, a second electrode, a second counter electrode provided between the second member region and the second electrode, and a second piezoelectric layer provided between the second electrode and the second counter electrode and supported by the supporter. The driver is configured to supply a first electrical signal between the first electrode and the first counter electrode and to supply a second electrical signal between the second electrode and the second counter electrode. The second electrical signal is different from the first electrical signal. The second element has at least one of a second length or a second thickness. The second length is different from a first length. The second thickness is different from a first thickness. The first length is a length of the first piezoelectric layer along a second direction crossing a first direction. The first direction is from the first counter electrode toward the first electrode. The second length is a length of the second piezoelectric layer along the second direction. The first thickness is a thickness of the first member region along the first direction. The second thickness is a thickness of the second member region along the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1A:
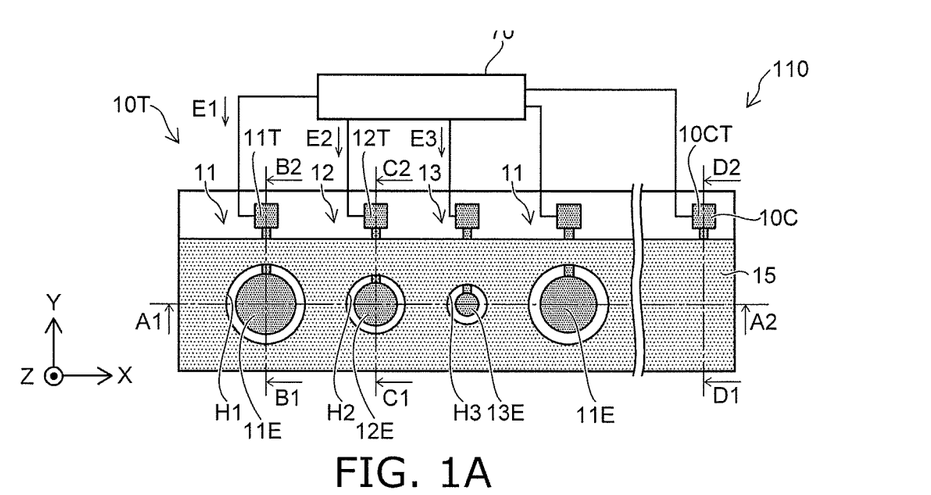
FIG. 1A to FIG. 1E are schematic views illustrating an ultrasonic device according to a first embodiment.
Figure 1B:
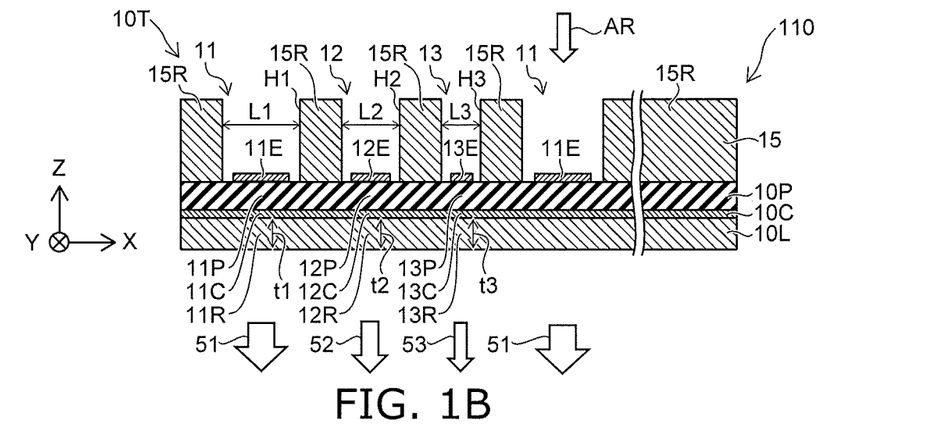
Figures 1C, 1D:
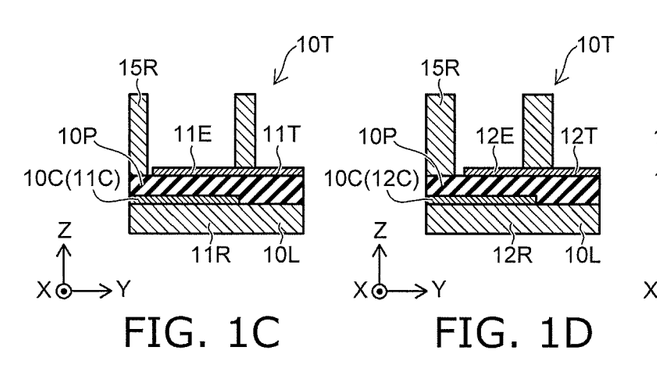
Figure 1E:
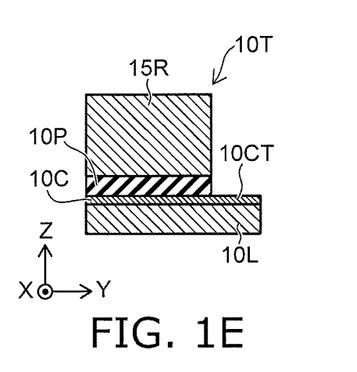

FIG. 1A to FIG. 1E are schematic views illustrating an ultrasonic device according to a first embodiment. FIG. 1A is a plan view as viewed along arrow AR of FIG. 1B. FIG. 1B is a line A1-A2 cross-sectional view of FIG. 1A. FIG. 1C is a line B1-B2 cross-sectional view of FIG. 1A. FIG. 1D is a line C1-C2 cross-sectional view of FIG. 1A. FIG. 1E is a line D1-D2 cross-sectional view of FIG. 1A.

As shown in FIG. 1A, the ultrasonic device 110 according to the embodiment includes an ultrasonic transmitter 10T. The ultrasonic transmitter 10T includes a first element 11, a second element 12, and a driver 70. A third element 13 is further provided in the example. The third element 13 may be omitted. The case where the third element 13 is provided will now be described.

For example, a set of the first to third elements 11 to 13 may be repeatedly provided. In the example, the ultrasonic transmitter 10T further includes a supporter 15 in addition to these elements (the first to third elements 11 to 13, etc.).

As shown in FIG. 1B, the first element 11 includes a first member region 11R, a first electrode 11E, a first counter electrode 11C, and a first piezoelectric layer 11P. The first counter electrode 11C is provided between the first member region 11R and the first electrode 11E. The first piezoelectric layer 11P is provided between the first electrode 11E and the first counter electrode 11C. The first piezoelectric layer 11P is supported by the supporter 15.

As shown in FIG. 1B, the second element 12 includes a second member region 12R, a second electrode 12E, a second counter electrode 12C, and a second piezoelectric layer 12P. The second counter electrode 12C is provided between the second member region 12R and the second electrode 12E. The second piezoelectric layer 12P is provided between the second electrode 12E and the second counter electrode 12C. The second piezoelectric layer 12P is supported by the supporter 15.

Similarly, the third element 13 includes a third member region 13R, a third electrode 13E, a third counter electrode 13C, and a third piezoelectric layer 13P. The third counter electrode 13C is provided between the third member region 13R and the third electrode 13E. The third piezoelectric layer 13P is provided between the third electrode 13E and the third counter electrode 13C. The third piezoelectric layer 13P is supported by the supporter 15.

For example, the supporter 15 has multiple holes (a first hole H1, a second hole H2, a third hole H3, etc.). The first electrode 11E is provided inside the first hole H1. The second electrode 12E is provided inside the second hole H2. The third electrode 13E is provided inside the third hole H3.

Other than the holes recited above, the supporter 15 includes a region 15R. For example, the first to third elements 11 to 13 recited above are supported by this region 15R.

In the example, the first piezoelectric layer 11P is continuous with the second piezoelectric layer 12P. The second piezoelectric layer 12P is continuous with the third piezoelectric layer 13P. The first piezoelectric layer 11P, the second piezoelectric layer 12P, and the third piezoelectric layer 13P are, for example, portions of a piezoelectric layer 10P.

In the example, the first member region 11R is continuous with the second member region 12R. The second member region 12R is continuous with the third member region 13R. The first member region 11R, the second member region 12R, and the third member region 13R are, for example, portions of a first layer 10L.

In the example, the first counter electrode 11C is continuous with the second counter electrode 12C. The second counter electrode 12C is continuous with the third counter electrode 13C. The first counter electrode 11C, the second counter electrode 12C, and the third counter electrode 13C are, for example, portions of a counter electrode layer 10C.

On the other hand, the first electrode 11E and the second electrode 12E are separated from each other. The third electrode 13E is separated from the first electrode 11E and the second electrode 12E.

The driver 70 is electrically connected to the first electrode 11E and the first counter electrode 11C (the counter electrode layer 10C). The driver 70 is electrically connected to the second electrode 12E and the second counter electrode 12C (the counter electrode layer 10C). The driver 70 is electrically connected to the third electrode 13E and the third counter electrode 13C (the counter electrode layer 10C).

Electrical signals are supplied to these elements from the driver 70; and vibrations are generated in these elements. The vibrations are caused by stress generated in the piezoelectric layer 10P. The vibrations are, for example, flexing vibrations. The ultrasonic transmitter 10T includes, for example, an air-coupled ultrasonic transducer array.

The frequencies (the resonant frequencies) of the flexing vibrations are dependent on the size and the thickness of the element, etc.

The direction from the first counter electrode 11C toward the first electrode 11E is taken as a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

The first direction (the Z-axis direction) corresponds to the thickness direction (or the stacking direction) of the element. A direction (e.g., a second direction) that crosses the first direction corresponds to the size-direction of the element.

In the embodiment as shown in FIG. 1B, the first element 11 has a first length L1 and a first thickness t1. The second element 12 has a second length L2 and a second thickness t2. The third element 13 has a third length L3 and a third thickness t3.

The first length L1 is the length of the first piezoelectric layer 11P along the second direction (the direction crossing the first direction recited above). In the example, the second direction is the X-axis direction. The second direction may be any direction along the X-Y plane. The second length L2 is the length of the second piezoelectric layer 12P along the second direction. The third length L3 is the length of the third piezoelectric layer 13P along the second direction.

For example, the first piezoelectric layer 11P includes a portion not overlapping the supporter 15 (the region 15R) in the Z-axis direction. The first length L1 corresponds to the length along the second direction of the portion not overlapping the supporter 15. For example, the first length L1 corresponds to the size along the second direction of the first hole H1.

For example, the second piezoelectric layer 12P includes a portion not overlapping the supporter 15 (the region 15R) in the Z-axis direction. The second length L2 corresponds to the length along the second direction of the portion not overlapping the supporter 15. For example, the second length L2 corresponds to the size along the second direction of the second hole H2.

For example, the third piezoelectric layer 13P includes a portion not overlapping the supporter 15 (the region 15R) in the Z-axis direction. The third length L3 corresponds to the length along the second direction of the portion not overlapping the supporter 15. For example, the third length L3 corresponds to the size along the second direction of the third hole H3.

In the example, the first to third lengths L1 to L3 are different from each other.

The first thickness t1 is the thickness of the first member region 11R along the first direction (the Z-axis direction). The second thickness t2 is the thickness of the second member region 12R along the first direction. The third thickness t3 is the thickness of the third member region 13R along the first direction. In the example, these thicknesses are the same. As described below, these thicknesses may be different from each other.

In the example as recited above, the first to third lengths L1 to L3 are different from each other. Thereby, the resonant frequencies of the first to third elements 11 to 13 are different from each other. For example, the first element 11 has a first resonant frequency. The second element 12 has a second resonant frequency. The third element 13 has a third resonant frequency. The second resonant frequency is different from the first resonant frequency. The third resonant frequency is different from the first resonant frequency and different from the second resonant frequency.

For example, the first element 11 is flexing-vibratable at the first resonant frequency. The second element 12 is flexing-vibratable at the second resonant frequency. The third element 13 is flexing-vibratable at the third resonant frequency.

These vibrations are based on the electrical signals supplied from the driver 70.

For example, as shown in FIG. 1C, a first terminal 11T that is electrically connected to the first electrode 11E is provided. As shown in FIG. 1D, a second terminal 12T that is electrically connected to the second electrode 12E is provided. As shown in FIG. 1E, a counter terminal 10CT that is electrically connected to the counter electrode layer 10C (the first counter electrode 11C and the second counter electrode 12C) is provided.

As shown in FIG. 1A, the driver 70 is electrically connected to these terminals.

The driver 70 supplies a first electrical signal E1 between the first electrode 11E and the first counter electrode 11C. The driver 70 supplies a second electrical signal E2 between the second electrode 12E and the second counter electrode 12C. The driver 70 supplies a third electrical signal E3 between the third electrode 13E and the third counter electrode 13C. The second electrical signal E2 is different from the first electrical signal E1. The third electrical signal is different from the first electrical signal E1 and different from the second electrical signal E2.

For example, the first electrical signal E1 includes a first signal having a first frequency. The second electrical signal E2 includes a second signal having a second frequency. The second frequency is different from the first frequency. The third electrical signal E3 includes a third signal having a third frequency. The third frequency is different from the first frequency and different from the second frequency.

Thus, the driver 70 can supply mutually-different electrical signals to the multiple elements.

Thereby, as shown in FIG. 1B, ultrasonic waves (first to third ultrasonic waves 51 to 53, etc.) that have mutually-different frequencies are emitted from the multiple elements. For example, the first to third ultrasonic waves 51 to 53 are emitted respectively from the first to third elements 11 to 13.

The resonant frequencies of the multiple elements are different from each other. Therefore, for example, the effects of the first ultrasonic wave 51 emitted from the first element 11 on the other elements (e.g., the second element 12, etc.) are suppressed. Thereby, for example, crosstalk is suppressed. Because the crosstalk is suppressed, the distances between the multiple elements can be short compared to the case where crosstalk occurs. For example, an ultrasonic device can be provided in which the resolution (e.g., the in-plane resolution) can be improved.

As recited above, the first resonant frequency of the first element 11 is different from the second resonant frequency of the second element 12. The driver 70 supplies, to the multiple elements, electrical signals matching the resonant frequencies of the multiple elements.

For example, as described above, the first electrical signal E1 that is supplied from the driver 70 includes the first signal having the first frequency. The second electrical signal E2 includes the second signal having the second frequency. The frequencies of these electrical signals respectively match the resonant frequencies of the multiple elements.

For example, the ratio, to the first frequency, of the absolute value of the difference between the first resonant frequency and the first frequency of the first signal included in the first electrical signal E1 is 0.1 or less. The ratio, to the second frequency, of the absolute value of the difference between the second resonant frequency and the second frequency of the second signal included in the second electrical signal E2 is 0.1 or less.

For example, the first frequency of the first signal is not less than 0.9 times and not more than 1.1 times a first resonant frequency. For example, the second frequency of the second signal is not less than 0.9 times and not more than 1.1 times a second resonant frequency. Thus, electrical signals that include signals having frequencies substantially matching the resonant frequencies of the multiple elements are respectively supplied from the driver 70 to the multiple elements. An ultrasonic wave of the resonant frequency unique to the element is emitted efficiently from each of the multiple elements.

For example, there is a reference example in which multiple elements are provided; and the resonant frequencies of the multiple elements are the same. It was found that crosstalk occurs in the reference example. For example, the first to third elements 11 to 13 are provided in the reference example. It was found that in the case where an electrical signal is supplied only to the first element 11 and electrical signals are not supplied to the second element 12 and the third element 13, a resonance of −3 dB is generated in the second element 12; and a resonance of −7 dB is generated in the third element 13. It is considered that this is because in the reference example, the vibration of the first element 11 is transmitted to the other elements via, for example, the first layer 10L, the piezoelectric layer 10P, the counter electrode layer 10C, etc.

In the embodiment, the resonant frequencies of the multiple elements are different from each other; therefore, the effects of the vibration of one element on the vibrations of the other elements can be suppressed.

In the example shown in FIG. 1B, the resonant frequency of an element provided to be adjacent to one element is modified from the resonant frequency of the one element. For example, in the case where multiple first elements 11 are provided, the multiple first elements 11 are not provided to be adjacent to each other. In the example shown in FIG. 1B, the second element 12 and the third element 13 are provided between the multiple first elements 11. The distance between one of the multiple first elements 11 and another one of the multiple first elements 11 is sufficiently long. Thereby, the crosstalk between the two first elements 11 is suppressed.

Thus, in the case where the multiple first elements 11 are provided, for example, at least a portion of the second element 12 is provided between one of the multiple first elements 11 and another one of the multiple first elements 11.

The multiple first elements 11 may be arranged along the second direction (e.g., the X-axis direction). In such a case, the position in the second direction of the second element 12 is between the position in the second direction of one of the multiple first elements 11 and the position in the second direction of another one of the multiple first elements 11.

Thus, in the embodiment, the first element 11 that is flexing-vibratable at the first resonant frequency is provided; and the second element 12 that is flexing-vibratable at the second resonant frequency that is different from the first resonant frequency is provided. The driver 70 supplies, to the first element 11, the first electrical signal E1 including the first signal having the first resonant frequency, and supplies, to the second element 12, the second electrical signal E2 including the second signal having the second resonant frequency. Thereby, for example, the crosstalk is suppressed. An ultrasonic device can be provided in which the resolution can be increased.

In one example, another electrode is not provided between the first electrode 11E and the second electrode 12E. The first element 11 is adjacent to the second element 12. The crosstalk can be suppressed effectively because the resonant frequencies of the mutually-adjacent elements are different from each other.

An example of a characteristic of the ultrasonic device will now be described.

Figure 2:
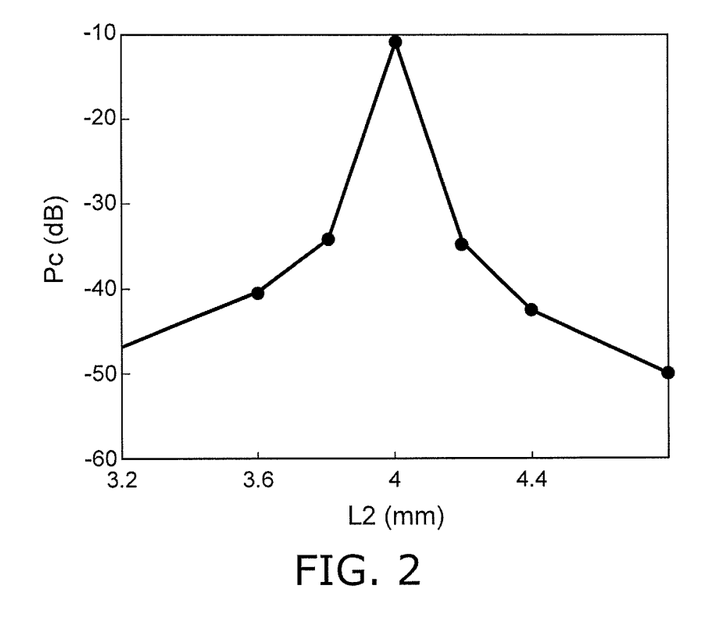
FIG. 2 is a graph illustrating a characteristic of the ultrasonic device.

FIG. 2 is a graph illustrating a characteristic of the ultrasonic device.

FIG. 2 is simulation results of the vibration of the second element 12 when the first element 11 vibrates. In the simulation model, the first element 11 and the second element 12 are provided; but the third element 13 is not provided. In the simulation model, the first layer 10L (the first member region 11R and the second member region 12R) is a layer of stainless steel having a thickness of 150 μm. The piezoelectric layer 10P (the first piezoelectric layer 11P and the second piezoelectric layer 12P) is PZT having a thickness of 150 μm. The supporter 15 is a sheet of stainless steel having a thickness of 4 mm. The first thickness t1 is the same as the second thickness t2.

The first length L1 is 4 mm. In other words, the size of the first hole H1 is 4 mm. The second length L2 is modified. The vibration of the second element 12 when an electrical signal of the resonant frequency of the first element 11 is supplied to the first element 11 is simulated.

The horizontal axis of FIG. 2 is the second length L2 (mm). The vertical axis is an intensity Pc (dB) of the vibration (the crosstalk) of the second element 12.

As shown in FIG. 2, crosstalk of about −10 dB is generated when the second length L2 is the same as the first length L1, i.e., 4 mm. The intensity Pc of the crosstalk decreases as the second length L2 moves away from 4 mm. For example, the intensity Pc of the crosstalk is about −40 dB (about 1/100) when the second length L2 is 3.6 mm or 4.4 mm.

According to the embodiment, the crosstalk can be suppressed; and the resolution can be increased.

Figure 3A:
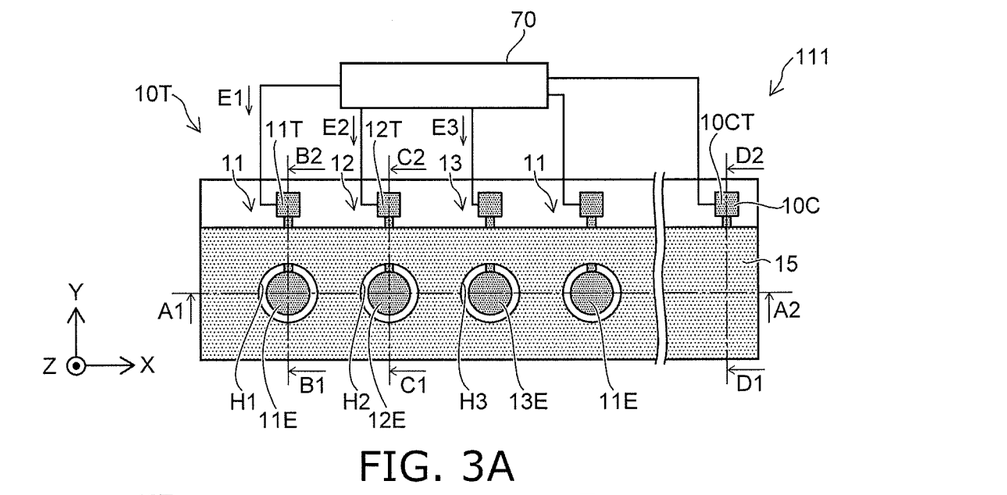
FIG. 3A to FIG. 3E are schematic views illustrating an ultrasonic device according to the first embodiment.
Figure 3B:
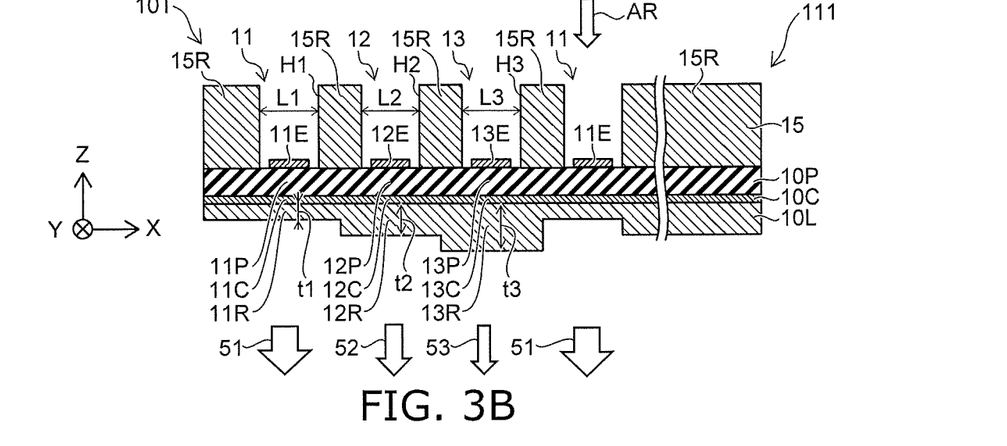
Figure 3C:
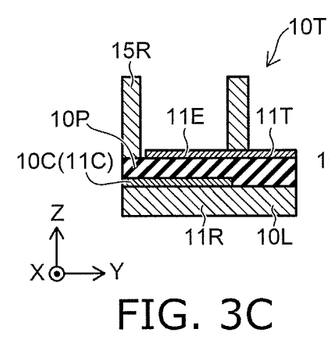
Figure 3D:
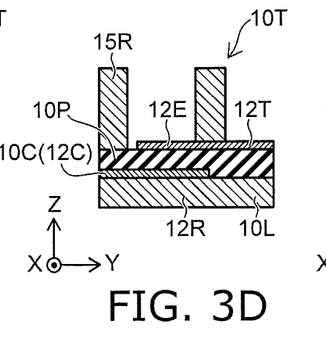
Figure 3E:
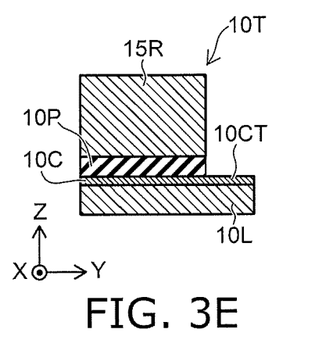

FIG. 3A to FIG. 3E are schematic views illustrating an ultrasonic device according to the first embodiment. FIG. 3A is a plan view as viewed along arrow AR of FIG. 3B. FIG. 3B is a line A1-A2 cross-sectional view of FIG. 3A. FIG. 3C is a line B1-B2 cross-sectional view of FIG. 3A. FIG. 3D is a line C1-C2 cross-sectional view of FIG. 3A. FIG. 3E is a line D1-D2 cross-sectional view of FIG. 3A.

As shown in FIG. 3A, the ultrasonic device 111 according to the embodiment also includes the ultrasonic transmitter 10T. The ultrasonic transmitter 10T includes the first to third elements 11 to 13 and the driver 70. In the ultrasonic device 111, the first to third thicknesses t1 to t3 are different from each other. On the other hand, the first to third lengths L1 to L3 are the same. Otherwise, the configuration of the ultrasonic device 111 is the same as the configuration of the ultrasonic device 110.

In the ultrasonic device 111, the first to third resonant frequencies are different from each other because the first to third thicknesses t1 to t3 are different from each other. Thereby, the crosstalk can be suppressed. The resolution can be increased.

Figure 4A:
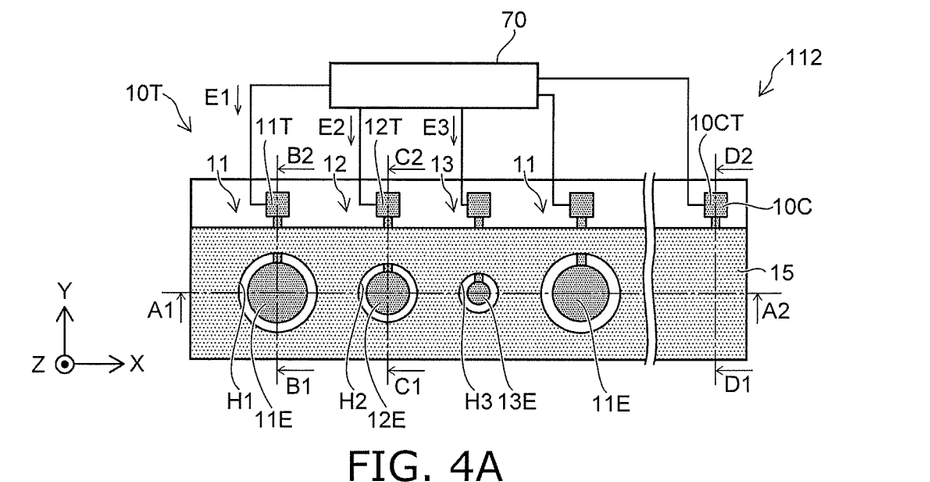
FIG. 4A to FIG. 4E are schematic views illustrating an ultrasonic device according to the first embodiment.
Figure 4B:
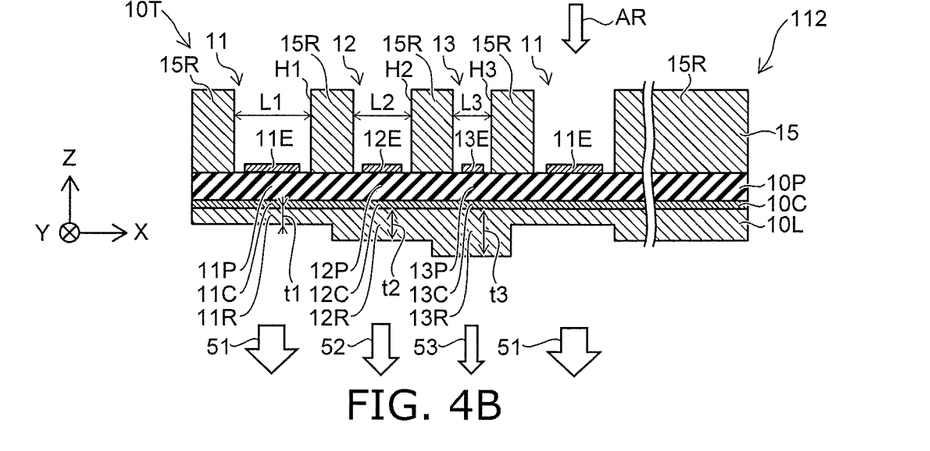
Figure 4C:
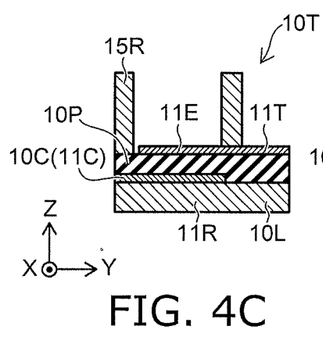
Figure 4D:
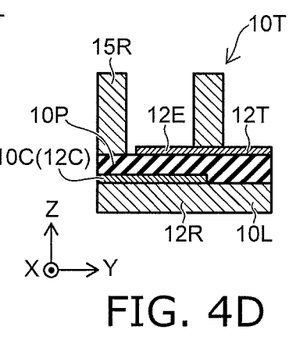
Figure 4E:
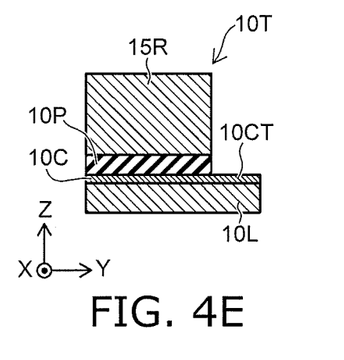

FIG. 4A to FIG. 4E are schematic views illustrating an ultrasonic device according to the first embodiment. FIG. 4A is a plan view as viewed along arrow AR of FIG. 4B. FIG. 4B is a line A1-A2 cross-sectional view of FIG. 4A. FIG. 4C is a line B1-B2 cross-sectional view of FIG. 4A. FIG. 4D is a line C1-C2 cross-sectional view of FIG. 4A. FIG. 4E is a line D1-D2 cross-sectional view of FIG. 4A.

As shown in FIG. 4A, the ultrasonic device 112 according to the embodiment also includes the ultrasonic transmitter 10T. The ultrasonic transmitter 10T includes the first to third elements 11 to 13 and the driver 70. In the ultrasonic device 112, the first to third thicknesses t1 to t3 are different from each other; and the first to third lengths L1 to L3 are different from each other. Otherwise, the configuration of the ultrasonic device 112 is the same as the configuration of the ultrasonic device 110 or 111. In the ultrasonic device 112, the first to third resonant frequencies are different from each other because the first to third thicknesses t1 to t3 are different from each other and the first to third lengths L1 to L3 are different from each other. Thereby, the crosstalk can be suppressed. The resolution can be increased. Thus, in the embodiment, the second element 12 may have at least one of the second length L2 that is different from the first length L1, or the second thickness t2 that is different from the first thickness t1.

Generally, a resonant frequency f0 of a flexing vibration element is represented by the following formulas.

$$f0 = 4(5)^{1/2} t/(3L^2) \times \{Y/\{\rho(1-v^2)\}\}^{1/2}$$

$$Y = 1/s_{11}^E$$

$$v = -s_{12}^E/s_{11}^E$$

"t" recited above is the thickness of the vibration element. "L" is the length (the size) of the vibration element. "ρ" is the density. "Y" and "v" are coefficients relating to the elasticity.

It can be seen from the formulas recited above that the resonant frequency f0 increases as the thickness "t" increases. The resonant frequency f0 decreases as the length (the size) "L" lengthens.

FIG. 5A to FIG. 5D are schematic cross-sectional views illustrating portions of the ultrasonic device according to the first embodiment.

Figure 5A:
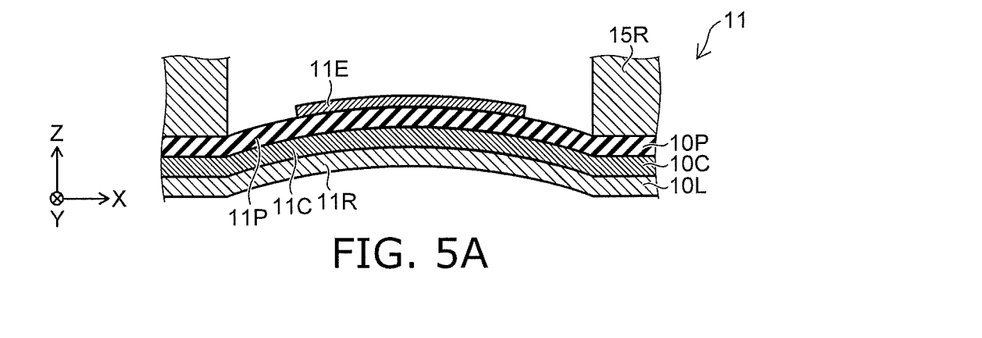
FIG. 5A to FIG. 5D are schematic cross-sectional views illustrating portions of the ultrasonic device according to the first embodiment.
Figure 5B:
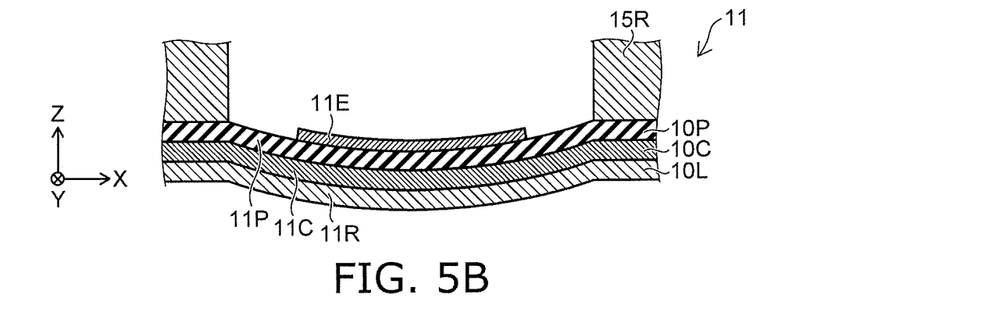

FIG. 5A corresponds to a first state of the first element 11. FIG. 5B corresponds to a second state of the first element 11. The first state corresponds to when a first signal S1 supplied to the first element 11 is one of positive or negative. The second state corresponds to when the first signal S1 supplied to the first element 11 is the other of positive or negative. As shown in FIG. 5A and FIG. 5B, the first piezoelectric layer 11P is flexing-vibratable. For example, the position of the center in the first direction (the Z-axis direction) of the first piezoelectric layer 11P changes in the first direction according to the first electrical signal E1.

Figure 5C:
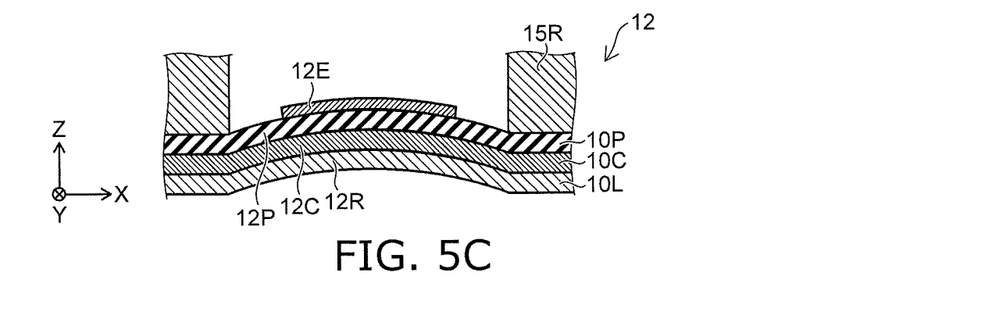
Figure 5D:
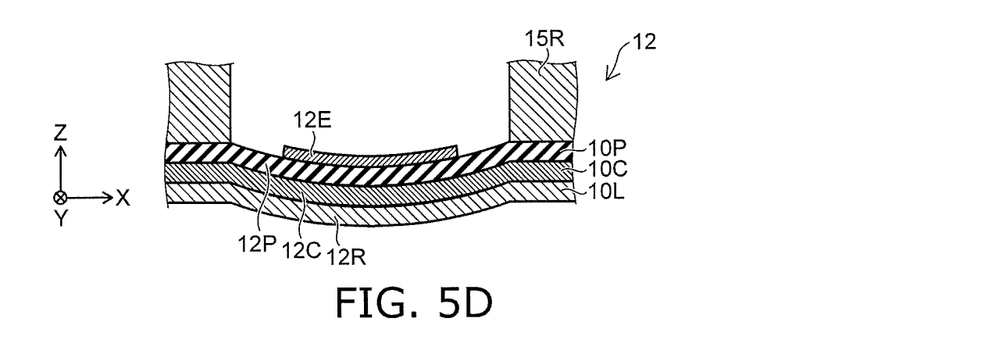

FIG. 5C corresponds to a third state of the second element 12. FIG. 5D corresponds to a fourth state of the second element 12. The third state corresponds to when a second signal S2 supplied to the second element 12 is one of positive or negative. The fourth state corresponds to when the second signal S2 supplied to the second element 12 is the other of positive or negative. As shown in FIG. 5C and FIG. 5D, the second piezoelectric layer 12P is flexing-vibratable. For example, the position of the center in the first direction (the Z-axis direction) of the second piezoelectric layer 12P changes in the first direction according to the second electrical signal E2.

On the other hand, there is a reference example using a thickness vibrator. The thickness vibrator generates an ultrasonic wave by changing the thickness. In such a case, the position of the center in the thickness direction does not change. In a reference example in which multiple elements using thickness vibrators are provided in the same plane, it is difficult to modify the resonant frequencies with respect to each other. For example, the cost increases.

Conversely, a flexing vibrator is used in the embodiment. In such a case, the resonant frequency can be modified easily by modifying the size or the thickness. For example, the resolution can be increased inexpensively.

An example of electrical signals supplied from the driver 70 will now be described.

Figure 6A:
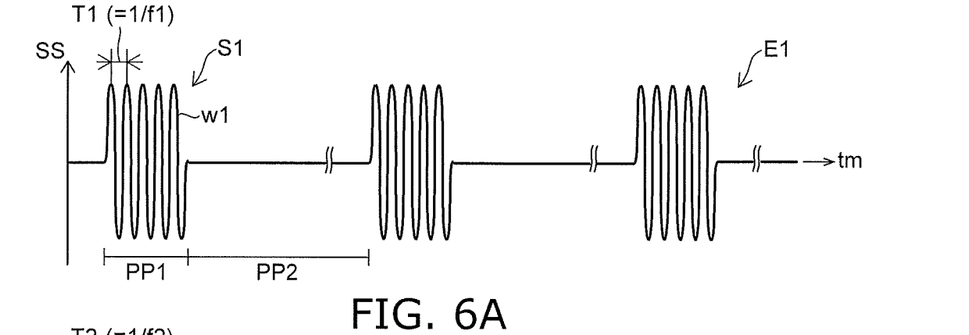
FIG. 6A and FIG. 6B are schematic views illustrating operations of the ultrasonic device according to the first embodiment.
Figure 6B:
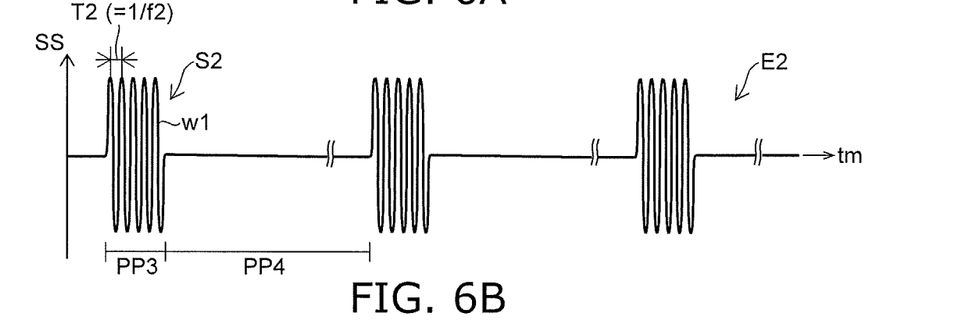

FIG. 6A and FIG. 6B are schematic views illustrating operations of the ultrasonic device according to the first embodiment.

FIG. 6A corresponds to the first electrical signal E1; and FIG. 6B corresponds to the second electrical signal E2. In these drawings, the horizontal axis corresponds to a time tm. The vertical axis corresponds to an intensity SS of the electrical signal.

As shown in FIG. 6A, the first electrical signal E1 includes the first signal S1. The first signal S1 has a first frequency f1. In the example, the first signal S1 includes multiple waves w1 of a first period T1. The first period T1 corresponds to the reciprocal of the first frequency f1. The multiple waves w1 have the first frequency f1. In the example, the first signal S1 includes five waves w1. The first element 11 can be vibrated efficiently at the first resonant frequency by the first signal S1.

On the other hand, as shown in FIG. 6B, the second electrical signal E2 includes the second signal S2. The second signal S2 has a second frequency f2. In the example, the second signal S2 includes multiple waves w2 of a second period T2. The second period T2 corresponds to the reciprocal of the second frequency f2. The multiple waves w2 have the second frequency f2. In the example, the second signal S2 includes five waves w2. The second element 12 can be vibrated efficiently at the second resonant frequency by the second signal S2.

In the embodiment, the first frequency f1 is different from the second frequency f2. Thereby, the crosstalk can be suppressed. For example, the desired vibrations of the first element 11 and the second element 12 are obtained even in the case where the first signal S1 and the second signal S2 are supplied at the same timing.

In the example, other than the first signal S1, a rest interval is provided. By providing the rest interval, for example, the change of the reflection/transmission of the ultrasonic wave by the inspection object can be separated and detected effectively.

For example, the first electrical signal E1 includes a first interval PP1, and a second interval PP2 after the first interval PP1. The first signal S1 is output in the first interval PP1. For example, the first signal S1 is not output in the second interval PP2. For example, the amplitude of the first electrical signal E1 in the second interval PP2 is less than the amplitude of the first signal S1.

For example, the second electrical signal E2 includes a third interval PP3, and a fourth interval PP4 after the third interval PP3. The second signal S2 is output in the third interval PP3. For example, the second signal S2 is not output in the fourth interval PP4. For example, the amplitude of the second electrical signal E2 in the fourth interval PP4 is less than the amplitude of the second signal S2.

The amplitude of the first electrical signal E1 in the second interval PP2 is 1/10 of the amplitude of the first signal S1 or less. The amplitude of the second electrical signal E2 in the fourth interval PP4 is 1/10 of the amplitude of the second signal S2 or less.

In the embodiment, at least a portion of the third interval PP3 may overlap the first interval PP1. At least a portion of the third interval PP3 may overlap the second interval PP2. At least a portion of the fourth interval PP4 may overlap the first interval PP1. At least a portion of the fourth interval PP4 may overlap the second interval PP2.

In one example, the length of the second interval PP2 is longer than the length of the first interval PP1. For example, the length of the second interval PP2 is 2 times the length of the first interval PP1 or more. The length of the second interval PP2 may be 5 times the length of the first interval PP1 or more.

The length of the fourth interval PP4 is longer than the length of the third interval PP3. For example, the length of the fourth interval PP4 is 2 times the length of the third interval PP3 or more. The length of the fourth interval PP4 is 5 times the length of the third interval PP3 or more.

The first frequency f1 is, for example, not less than 50 kHz and not more than 500 kHz. The second frequency f2 is not less than 50 kHz and not more than 500 kHz.

The first element 11 has a first resonant frequency fr1, a first "−6 dB fractional bandwidth," and a first center frequency. The intensity of the resonance at the first resonant frequency fr1 is taken to be 0 dB. The first element 11 has two frequencies at which the intensity of the resonance is −6 dB. In one example, the first center frequency is the arithmetic mean of the two frequencies. In another example, the first center frequency is the geometric mean of the two frequencies. The first "−6 dB fractional bandwidth" is the ratio of the absolute value of the difference between the two frequencies to the first center frequency.

The second element 12 has a second resonant frequency fr2, a second "−6 dB fractional bandwidth," and a second center frequency. The intensity of the resonance at the second resonant frequency fr2 is taken to be 0 dB. The second element 12 has two frequencies at which the intensity of the resonance is −6 dB. In one example, the second center frequency is the arithmetic mean of the two frequencies. In the other example, the second center frequency is the geometric mean of the two frequencies. The second "−6 dB fractional bandwidth" is the ratio of the absolute value of the difference between the two frequencies to the second center frequency.

In the case where the arithmetic mean of the two frequencies recited above is used as the first center frequency, the arithmetic mean of the two frequencies recited above is used as the second center frequency. In the case where the geometric mean of the two frequencies recited above is used as the first center frequency, the geometric mean of the two frequencies recited above is used as the second center frequency.

The absolute value of the difference between the first frequency f1 of the first signal and the second frequency f2 of the second signal is larger than the first "−6 dB fractional bandwidth." The absolute value of the difference between the first frequency f1 of the first signal and the second frequency f2 of the second signal is larger than the second "−6 dB fractional bandwidth." The frequencies of the two signals can be separated easily. The crosstalk can be suppressed; and an efficient resonance is obtained easily. For the flexing vibrator, the "−6 dB fractional bandwidth" is narrow (the ratio is small). The conditions recited above are obtained easily.

Figure 7A:
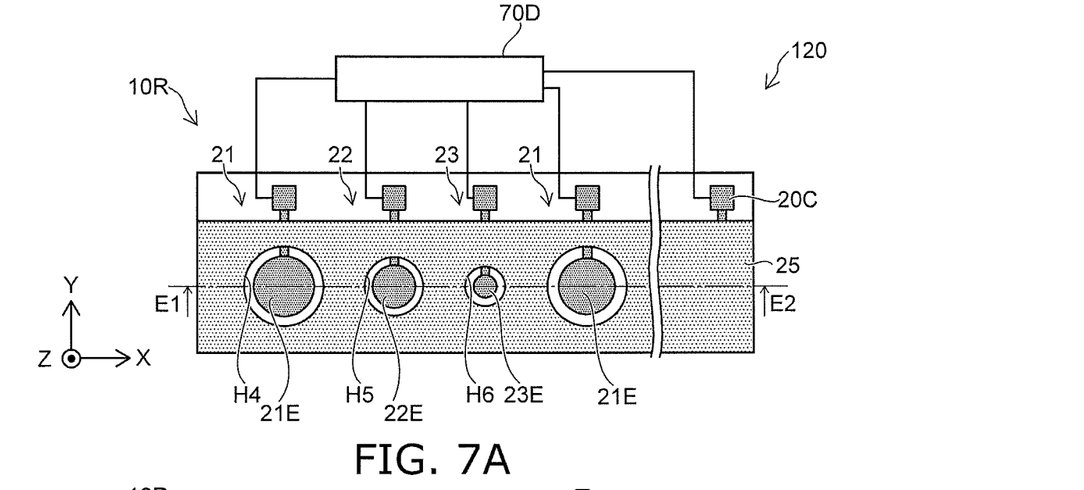
FIG. 7A and FIG. 7B are schematic views illustrating an ultrasonic device according to the first embodiment.
Figure 7B:
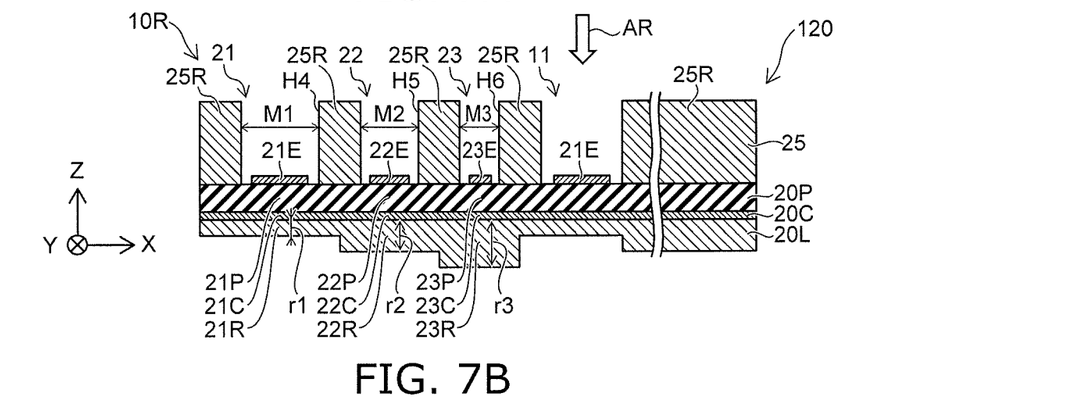

FIG. 7A and FIG. 7B are schematic views illustrating an ultrasonic device according to the first embodiment.

FIG. 7A is a plan view as viewed along arrow AR of FIG. 7B. FIG. 7B is a line E1-E2 cross-sectional view of FIG. 7A.

As shown in FIG. 7A, the ultrasonic device 120 according to the embodiment includes an ultrasonic receiver 10R. The ultrasonic device 120 may include the ultrasonic transmitter 10T and the ultrasonic receiver 10R. The ultrasonic transmitter 10T is not illustrated in FIG. 7A. In the ultrasonic device 120, the ultrasonic transmitter 10T may have any configuration described in reference to the ultrasonic devices 110 to 112. An example of the ultrasonic receiver 10R will now be described.

The ultrasonic receiver 10R includes a first receiving element 21, a second receiving element 22, and a detector 70D. A third receiving element 23 is further provided in the example. The third receiving element 23 may be omitted. The case where the third receiving element 23 is provided will now be described.

The resonant frequency of the first receiving element 21 is different from the resonant frequency of the second receiving element 22. The resonant frequency of the third receiving element 23 is different from the resonant frequency of the first receiving element 21 and different from the resonant frequency of the second receiving element 22.

The detector 70D detects the electrical signals obtained from the first receiving element 21, the second receiving element 22, and the third receiving element 23.

The ultrasonic receiver 10R may have a configuration similar to that of the ultrasonic transmitter 10T described above.

For example, a receiving supporter 25 is provided. Holes H4 to H6, etc., are provided in the receiving supporter 25.

For example, the first receiving element 21 includes a first receiving member region 21R, a first receiving electrode 21E, a first receiving counter electrode 21C provided between the first receiving member region 21R and the first receiving electrode 21E, and a first receiving piezoelectric layer 21P provided between the first receiving electrode 21E and the first receiving counter electrode 21C and supported by the receiving supporter 25.

For example, the second receiving element 22 includes a second receiving member region 22R, a second receiving electrode 22E, a second receiving counter electrode 22C provided between the second receiving member region 22R and the second receiving electrode 22E, and a second receiving piezoelectric layer 22P provided between the second receiving electrode 22E and the second receiving counter electrode 22C and supported by the receiving supporter 25.

For example, the third receiving element 23 includes a third receiving member region 23R, a third receiving electrode 23E, a third receiving counter electrode 23C provided between the third receiving member region 23R and the third receiving electrode 23E, and a third receiving piezoelectric layer 23P provided between the third receiving electrode 23E and the third receiving counter electrode 23C and supported by the receiving supporter 25.

The receiving supporter 25 includes a region 25R other than the holes (the holes H4 to H6, etc.) recited above. For example, the first to third receiving elements 21 to 23 recited above are supported by this region 25R.

The first receiving piezoelectric layer 21P, the second receiving piezoelectric layer 22P, and the third receiving piezoelectric layer 23P are, for example, portions of a receiving piezoelectric layer 20P. The first receiving member region 21R, the second receiving member region 22R, and the third receiving member region 23R are, for example, portions of a first receiving layer 20L. The first receiving counter electrode 21C, the second receiving counter electrode 22C, and the third receiving counter electrode 23C are, for example, portions of a receiving counter electrode layer 20C.

The detector 70D detects an electrical signal between the first receiving electrode 21E and the first receiving counter electrode 21C. The detector 70D detects an electrical signal between the second receiving electrode 22E and the second receiving counter electrode 22C. The detector 70D detects an electrical signal between the third receiving electrode 23E and the third receiving counter electrode 23C.

The resonant frequencies of the multiple receiving elements are different from each other.

For example, the first receiving element 21 has a first receiving length M1 and a first receiving thickness r1. The second receiving element 22 has a second receiving length M2 and a second receiving thickness r2. The third receiving element 23 has a third receiving length M3 and a third receiving thickness r3.

The first receiving length M1 is the length of the first receiving piezoelectric layer 21P along a second receiving direction crossing a first receiving direction; and the first receiving direction is from the first receiving counter electrode 21C toward the first receiving electrode 21E. The second receiving length M2 is the length of the second receiving piezoelectric layer 22P along the second receiving direction. The third receiving length M3 is the length of the third receiving piezoelectric layer 23P along the second receiving direction.

The first receiving thickness r1 is the thickness of the first receiving member region 21R along the first receiving direction recited above. The second receiving thickness r2 is the thickness of the second receiving member region 22R along the first receiving direction recited above. The third receiving thickness r3 is the thickness of the third receiving member region 23R along the first receiving direction recited above.

For example, the first to third receiving lengths M1 to M3 are different from each other. For example, the first to third receiving thicknesses r1 to r3 are different from each other.

For example, the second receiving element 22 may have at least one of the second receiving length M2 that is different from the first receiving length M1, or the second receiving thickness r2 that is different from the first receiving thickness r1.

In the ultrasonic receiver 10R of the ultrasonic device 120, the crosstalk when receiving can be suppressed.

Second Embodiment

The embodiment relates to an inspection device.

Figure 8:
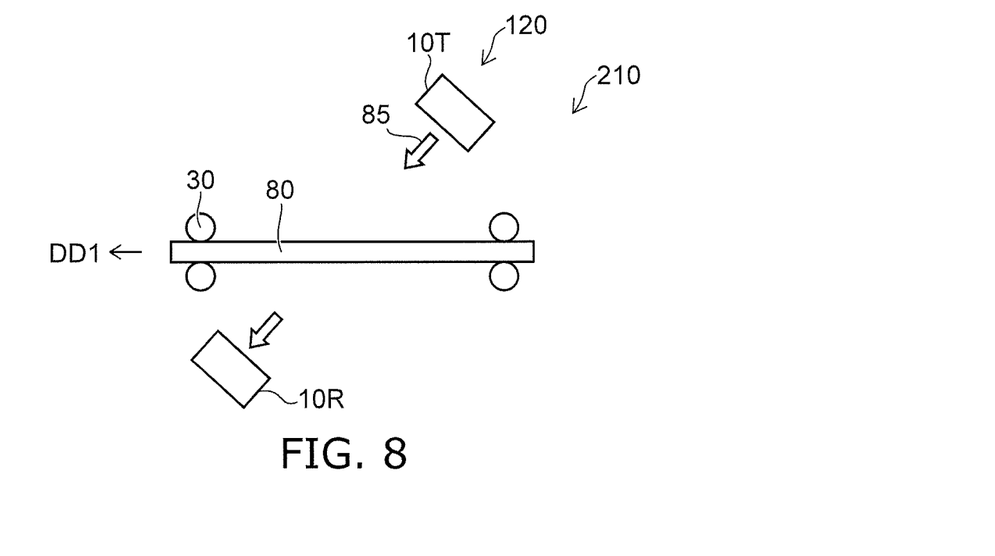
FIG. 8 is a schematic view illustrating the inspection device according to the second embodiment.

FIG. 8 is a schematic view illustrating the inspection device according to the second embodiment.

As shown in FIG. 8, the inspection device 210 includes the ultrasonic device 120 and a feeder 30. The ultrasonic device 120 includes the ultrasonic transmitter 10T and the ultrasonic receiver 10R. The feeder 30 moves an inspection object 80 between the ultrasonic transmitter 10T and the ultrasonic receiver 10R. The inspection object 80 is, for example, a banknote, etc.

The inspection object 80 is fed by the feeder 30; and the inspection object 80 passes through a space between the ultrasonic transmitter 10T and the ultrasonic receiver 10R. The feeder 30 is, for example, a roller, etc. The feeder 30 moves the inspection object 80 along a direction DD1 in the space. The direction DD1 crosses a direction from the ultrasonic transmitter 10T toward the ultrasonic receiver 10R.

The ultrasonic receiver 10R receives an ultrasonic wave 85 emitted from the ultrasonic transmitter 10T. The state of the received ultrasonic wave 85 changes according to the state of the inspection object 80. The state (e.g., an abnormality or the like) of the inspection object 80 can be detected by analyzing the received ultrasonic wave 85.

In the inspection device 210, for example, the inspection object 80 (e.g., a paper sheet or the like) that is fed at a high speed can be detected with high resolution and high precision.

According to the embodiments, an ultrasonic device and an inspection device can be provided in which the resolution can be increased.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in ultrasonic devices such as elements, drivers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all ultrasonic devices practicable by an appropriate design modification by one skilled in the art based on the ultrasonic devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An ultrasonic device, comprising:
    an ultrasonic transmitter, the ultrasonic transmitter including a first element; a second element; a supporter; and a driver,
    the first element including a first member region; a first electrode; a first counter electrode provided between the first member region and the first electrode; and a first piezoelectric layer provided between the first electrode and the first counter electrode and supported by the supporter,
    the second element including a second member region; a second electrode; a second counter electrode provided between the second member region and the second electrode; and a second piezoelectric layer provided between the second electrode and the second counter electrode and supported by the supporter,
    the driver being configured to supply a first electrical signal between the first electrode and the first counter electrode and to supply a second electrical signal between the second electrode and the second counter electrode, the second electrical signal being different from the first electrical signal,
    the second element having at least one of a second length or a second thickness, the second length being different from a first length, the second thickness being different from a first thickness,
    the first length being a length of the first piezoelectric layer along a second direction crossing a first direction, the first direction being from the first counter electrode toward the first electrode,
    the second length being a length of the second piezoelectric layer along the second direction,
    the first thickness being a thickness of the first member region along the first direction,
    the second thickness being a thickness of the second member region along the first direction,
    the supporter including a first hole and a second hole,
    the first electrode overlapping the first hole in the first direction,
    the second electrode overlapping the second hole in the first direction,
    the first piezoelectric layer including a first region and a second region, the first region overlapping the first hole in the first direction, the first region not overlapping the first electrode in the first direction, and the second region overlapping a part of the supporter in the first direction, and
    the second piezoelectric layer including a third region and a fourth region, the third region overlapping the second hole in the first direction, the third region not overlapping the second electrode in the first direction, and the fourth region overlapping another part of the supporter in the first direction.

2. The ultrasonic device according to claim 1, wherein
    the first electrical signal includes a first signal having a first frequency, and
    the second electrical signal includes a second signal having a second frequency.

3. The ultrasonic device according to claim 2, wherein
    the first electrical signal includes a first interval, and a second interval after the first interval,
    the first signal is output in the first interval,
    an amplitude of the first electrical signal in the second interval is less than an amplitude of the first signal,
    the second electrical signal includes a third interval, and a fourth interval after the third interval,
    the second signal is output in the third interval, and
    an amplitude of the second electrical signal in the fourth interval is less than an amplitude of the second signal.

4. The ultrasonic device according to claim 3, wherein
    the first signal includes a plurality of waves having the first frequency, and
    the second signal includes a plurality of waves having the second frequency.

5. The ultrasonic device according to claim 1, wherein
    a plurality of the first elements is provided,
    the plurality of first elements is arranged along the second direction, and
    a position in the second direction of the second element is between a position in the second direction of one of the plurality of first elements and a position in the second direction of another one of the plurality of first elements.

6. The ultrasonic device according to claim 1, further comprising an ultrasonic receiver, the ultrasonic receiver including:
    a first receiving element;
    a second receiving element; and a detector configured to detect an electrical signal obtained from the first receiving element and the second receiving element, a resonant frequency of the first receiving element being different from a resonant frequency of the second receiving element.

7. The ultrasonic device according to claim 1, wherein the first piezoelectric layer is flexing-vibratable, and the second piezoelectric layer is flexing-vibratable.

8. The ultrasonic device according to claim 1, wherein a position of a center in the first direction of the first piezoelectric layer changes in the first direction according to the first electrical signal, and a position of a center in the first direction of the second piezoelectric layer changes in the first direction according to the second electrical signal.

9. The ultrasonic device according to claim 1, wherein a first resonant frequency of the first element is different from a second resonant frequency of the second element.

10. The ultrasonic device according to claim 2, wherein a first resonant frequency of the first element is different from a second resonant frequency of the second element, a ratio of an absolute value of a difference between the first frequency and the first resonant frequency to the first frequency is 0.1 or less, and a ratio of an absolute value of a difference between the second frequency and the second resonant frequency to the second frequency is 0.1 or less.

11. The ultrasonic device according to claim 3, wherein the amplitude of the first electrical signal in the second interval is 1/10 of the amplitude of the first signal or less, and the amplitude of the second electrical signal in the fourth interval is 1/10 of the amplitude of the second signal or less.

12. The ultrasonic device according to claim 3, wherein a length of the second interval is 2 times a length of the first interval or more, and a length of the fourth interval is 2 times a length of the third interval or more.

13. The ultrasonic device according to claim 2, wherein the first frequency is not less than 50 kHz and not more than 500 kHz, and the second frequency is not less than 50 kHz and not more than 500 kHz.

14. The ultrasonic device according to claim 1, wherein a plurality of the first elements is provided, and at least a portion of the second element is between one of the plurality of first elements and another one of the plurality of first elements.

15. The ultrasonic device according to claim 1, wherein the first length corresponds to a size along the second direction of the first hole, and the second length corresponds to a size along the second direction of the second hole.

16. The ultrasonic device according to claim 1, wherein another electrode is not provided between the first electrode and the second electrode.

17. The ultrasonic device according to claim 1, wherein the first piezoelectric layer is continuous with the second piezoelectric layer.

18. The ultrasonic device according to claim 1, wherein the first member region is continuous with the second member region.

19. An inspection device, comprising:
the ultrasonic device according to claim 6; and
a feeder moving an inspection object between the ultrasonic transmitter and the ultrasonic receiver.

20. An ultrasonic device, comprising:
an ultrasonic transmitter, the ultrasonic transmitter including a first element, a second element, a supporter, and a driver, the first element including a first member region, a first electrode, a first counter electrode provided between the first member region and the first electrode, and a first piezoelectric layer provided between the first electrode and the first counter electrode and supported by the supporter;

the second element including a second member region, a second electrode, a second counter electrode provided between the second member region and the second electrode, and a second piezoelectric layer provided between the second electrode and the second counter electrode and supported by the supporter;

the driver being configured to supply a first electrical signal between the first electrode and the first counter electrode and to supply a second electrical signal between the second electrode and the second counter electrode, the second electrical signal being different from the first electrical signal;

the second element having at least one of a second length or a second thickness, the second length being different from a first length, the second thickness being different from a first thickness;

the first length being a length of the first piezoelectric layer along a second direction crossing a first direction, the first direction being from the first counter electrode toward the first electrode;

the second length being a length of the second piezoelectric layer along the second direction;

the first thickness being a thickness of the first member region along the first direction;

the second thickness being a thickness of the second member region along the first direction;

the supporter including a first hole and a second hole;

the first electrode overlapping the first hole in the first direction;

the second electrode overlapping the second hole in the first direction;

the first piezoelectric layer including a first region overlapping the first hole in the first direction, the first region not overlapping the first electrode in the first direction; and the second piezoelectric layer including a second region overlapping the second hole in the first direction, the second region not overlapping the second electrode in the first direction, wherein the first electrical signal includes a first signal having a first frequency and substantially not including a second frequency, and the second electrical signal includes a second signal having the second frequency and substantially not including the first frequency.

* * * * *